(12) United States Patent
Bayer et al.

(10) Patent No.: US 7,061,217 B2
(45) Date of Patent: Jun. 13, 2006

(54) INTEGRATED POWER SWITCHING CIRCUIT

(75) Inventors: Erich Bayer, Thonhausen (DE); Hans Schmeller, Forstern (DE)

(73) Assignee: Texas Instruments Deutschland, GmbH, Freising (DE)

( * ) Notice: Subject to any disclaimer, the term of this patent is extended or adjusted under 35 U.S.C. 154(b) by 0 days.

(21) Appl. No.: 11/042,296

(22) Filed: Jan. 24, 2005

(65) Prior Publication Data

US 2005/0161700 A1 Jul. 28, 2005

(51) Int. Cl.
*G05F 1/40* (2006.01)
(52) U.S. Cl. .................... 323/284; 323/317
(58) Field of Classification Search ......... 323/317, 323/284, 313, 314, 283
See application file for complete search history.

(56) References Cited

U.S. PATENT DOCUMENTS 4,051,428 A * 9/1977 Imai ........................ 323/317
6,320,449 B1 11/2001 Capici et al.

FOREIGN PATENT DOCUMENTS

EP 0788232 B1 8/1997

* cited by examiner

*Primary Examiner*—Shawn Riley
(74) *Attorney, Agent, or Firm*—J. Dennis Moore; W. James Brady, III; Frederick J. Telecky, Jr.

(57) ABSTRACT

A power switching circuit includes a power MOS transistor that has a maximum source-drain voltage substantially higher than a permissible gate-source voltage, and that has a current path connected in series with a load between first and second supply terminals, and comprising a gate driver circuit that drives the gate of the power MOS transistor directly from the supply voltage. A gate driver circuit has a pair of series-connected switching transistors connected between the first and second supply terminals. An interconnection node between the switching transistors is connected to the gate of the power MOS transistor. The gate driver circuit further includes a reference voltage source and a voltage comparator comparing the gate voltage of the power MOS transistor with the reference voltage to provide a disabling output that disables one of the switching transistors when the gate voltage of the power MOS transistor reaches the reference voltage. By selecting a reference voltage level not higher than the maximum permissible gate-to-source voltage of the power MOS transistor, its gate is effectively protected from excessive gate-to-source voltage. Yet, the switching transistor in the gate driver circuit other than that connected to the ground supply terminal (usually referred to as Vcc terminal), may have its current path connected directly, or through just a feedback resistor, to the high supply terminal (usually referred to as Vcc terminal).

6 Claims, 1 Drawing Sheet

INTEGRATED POWER SWITCHING CIRCUIT

CROSS REFERENCE TO RELATED APPLICATIONS

This application claims priority under 35 USC § 119 of Germany Application Serial No. 102004270.5, filed Jan. 28, 2004.

FIELD OF THE INVENTION

The present invention relates to an integrated power switching circuit comprising a power MOS transistor that has a maximum source-drain voltage substantially higher than a permissible gate-source voltage.

BACKGROUND OF THE INVENTION

Modern analog CMOS processes offer so-called "extended drain" high-voltage power MOS transistors that have up to 30V of maximum drain-to-source voltage. The admissible gate-to-source voltage is only 7 V. Other modern processes offer power DMOS transistors with a maximum drain-to-source voltage up to 60 V. In this case, the admissible gate-to-source voltage is limited to 16 V. With these transistors, inductive voltage-converters can be built for supply voltages above 10 V and even up to 20 V. A problem with these transistors is that their gates cannot be driven directly from the supply voltage since the maximum gate-to-source voltage is limited to a value considerably below the supply voltage.

A conventional approach to solve this problem is the use of a linear voltage regulator that provides a limited voltage for the gate drive circuits of the power transistors. Such a voltage regulator must deliver the full charging current for the gate of the power transistor. For large power transistors the gate charging current is on the order of one Ampère, although for a short duration of only a few nanoseconds. When other circuit blocks are also supplied from the voltage regulator, its output voltage must not drop when the power transistor is turned on, as this would cause disturbance of those circuit blocks. Therefore, the voltage regulator must have a large pass transistor. Alternatively, a buffer capacitor could be used but, in order to be effective, a buffer capacitor would be much bigger than the gate capacitance of the power transistor and could not be integrated. A requirement for an off-chip capacitor is often not acceptable. Also, when a voltage regulator is used, the gate charge current path contains the pass transistor of the regulator in series with the switching transistor of the gate drive circuit. For the same amount of effective resistance in the gate charge current path compared to a single switching transistor in that current path, each of the series-connected transistors must be two times the size of a single switching transistor.

SUMMARY OF THE INVENTION

The present invention provides an integrated power switching circuit comprising a power MOS transistor that has a maximum source-drain voltage substantially higher than a permissible gate-source voltage, and that has a current path connected in series with a load between first and second supply terminals, and comprising a gate driver circuit that drives the gate of the power MOS transistor directly from the supply voltage. Specifically, the integrated power switching circuit of the invention comprises a gate driver circuit that has a pair of series-connected switching transistors connected between the first and second supply terminals. An interconnection node between the switching transistors is connected to the gate of the power MOS transistor. The gate driver circuit further comprises a reference voltage source and a voltage comparator comparing the gate voltage of the power MOS transistor with the reference voltage to provide a disabling output that disables one of the switching transistors when the gate voltage of the power MOS transistor reaches the reference voltage. By selecting a reference voltage level not higher than the maximum permissible gate-to-source voltage of the power MOS transistor, its gate is effectively protected from excessive gate-to-source voltage. Yet, the switching transistor in the gate driver circuit other than that connected to the ground supply terminal (usually referred to as Vcc terminal), may have its current path connected directly, or through just a feedback resistor, to the high supply terminal (usually referred to as Vcc terminal).

In accordance with a preferred embodiment, the gate driver circuit comprises a flip-flop with a first input receiving an input signal, an output connected to the gate of the switching transistor on the side of the high supply terminal and a second input connected to an output of the voltage comparator. The flip-flop is set by the input signal and reset by the output from the voltage comparator. When and as long as the flip-flop is set, the switching transistor on the side of the high supply terminal is ON to feed a charge current directly from the high supply voltage to the gate of the power MOS transistor. When the flip-flop is reset, the switching transistor is turned off. The gate of the power MOS transistor requires no more charge current in this condition. However, to maintain the bias on the gate of the power MOS transistor over a very long period of time, particularly when DC operation is required, a hold switch connects the gate to the reference voltage source, preferably through a resistor of a relatively high value to avoid loading of the reference voltage source and permit the reference voltage source to be used for other purposes.

In a still further preferred embodiment, the voltage comparator is materialised by a dynamically biased voltage sensor. Specifically, a voltage-sense MOS transistor has a source connected to the gate of the power MOS transistor, a gate connected to receive a gate voltage derived from the reference voltage source, and a drain connected to feed current into a current mirror wherein the mirrored current provides the disabling output (the reset signal) to the flip-flop. The gate of the voltage-sense MOS transistor is preferably connected to the output of the flip-flop through a feed-forward capacitor to speed-up switching.

DETAILED DESCRIPTION OF THE DRAWINGS

Figure 1:
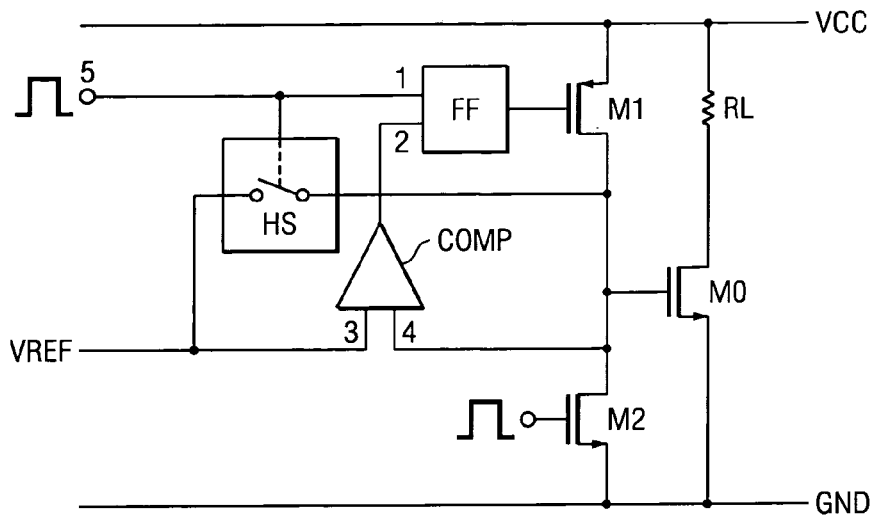
FIG. 1 is a schematic block diagram of an inventive power switching circuit.

With reference to FIG. 1 a gate driver circuit for a power MOS transistor M0 consists mainly of a pair of complementary switching MOS transistors M1 and M2, a flip-flop FF, a comparator COMP and a hold switch HS. The integrated power switching circuit is specifically useful for an application such as a voltage converter which requires a supply voltage VCC in excess of a normal supply voltage range for integrated CMOS circuits. In this example the supply voltage may be as high as 10 to 20 V or even higher.

In FIG. 1 the power NMOS transistor M0 is connected with its source to the ground supply terminal GND and with its drain to a load RL, which is connected with its other lead to the voltage supply terminal VCC. The switching transistors M1 and M2 are connected in series directly between voltage supply terminal VCC and ground supply terminal GND. The PMOS transistor M1 is a "turn-ON" switch and connected with its source to VCC, while the NMOS transistor M2, which is a "turn-OFF" switch, is connected with its source to GND. The two transistors M1 and M2 are interconnected at their drains. This interconnection node is also connected to the gate of M0. The gate of the "turn-ON" switch M1 is connected to the output of flip-flop FF. The flip-flop has two inputs 1 and 2. Input 1 is connected to a signal input 5, to which a control input signal is fed, while input 2 is connected to an output of voltage comparator COMP. Comparator COMP has two inputs 3 and 4. Input 3 is connected to a reference voltage source VREF, the level of Which is less than or equal to the maximum admissible gate-to-source voltage of the power transistor M0. Input 4 of the comparator is connected to the gate of M0. The block diagram further comprises a hold switch HS, which is connected between reference voltage source VREF and the gate of M0 and which is controlled by the control input signal at input 5. The gate of "turn-OFF" transistor M2 receives a control input signal of the same polarity as that of the control input signal.

When the control input signal at input 5 goes from a high to a low level, the output of the negative edge triggered flip-flop FF is set to low and the hold switch HS is closed. As the output signal of flip-flop FF is applied to the gate of transistor M1, this transistor is switched ON and forces a charge current IG-charge into the gate capacitance of the power transistor M0. Due to the non-zero resistance in the channel of transistor M1 in its ON-state and to the large gate capacitance of M0, which may be in a range of several hundred pico farads, the gate-to-source voltage cannot rise instantaneously. Instead, the gate-to-source voltage needs about 10 to 20 ns to rise to a value of about 7 volts, which is the maximum admissible gate-to-source voltage, when an "extended drain" high-voltage power MOS transistor is used. The gate voltage applied to input 4 of comparator COMP is compared to the reference voltage VREF. When the gate-to-source voltage of M0 becomes equal to VREF, which should be less than the maximum admissible value, the comparator generates a disabling output that resets flip-flop FF. This switches the flip-flop output to a high level and thus turns OFF transistor M1. With M1 switched OFF, the gate voltage of power transistor M0 stops to rise. But with the hold switch HS closed, the gate voltage of M0 is maintained on the level of VREF, as long as the control input signal remains on a low level. This ensures reliable DC operation.

Figure 2:
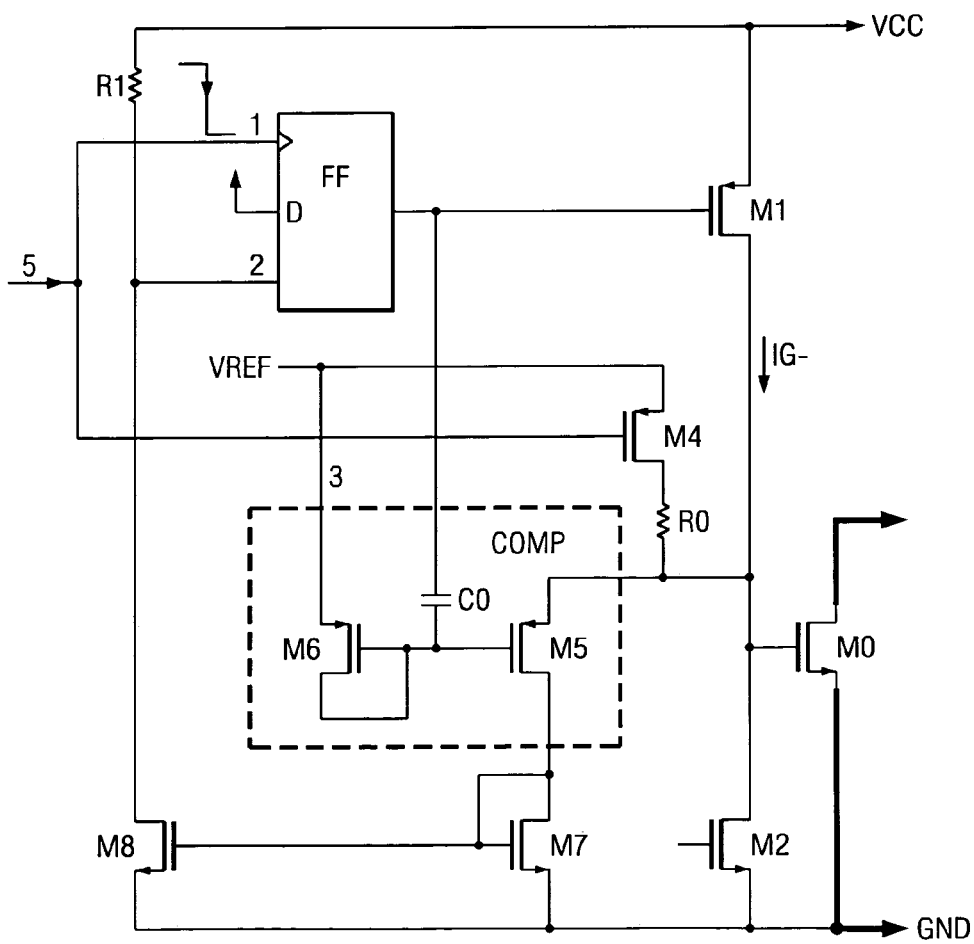
FIG. 2 is a more detailed diagram of the power switching circuit.

In the more detailed diagram in FIG. 2 the same reference signs as in FIG. 1 are used where applicable. M0 is the power NMOS transistor, with its source connected to ground GND. M1 and M2 are the "switch-ON" and "switch-OFF" transistors, respectively. They are interconnected in series, with the source of PMOS transistor M1 being connected to VCC and the source of NMOS transistor M2 being connected to GND. The drains interconnected and connected with the gate of M0. The gate of transistor M1 is connected to the output of flip-flop FF. The flip-flop FF is negative edge triggered. Its input 1 is connected to signal input 5, while the reset input 2 is connected via a resistor R1 to the supply voltage VCC and to the drain of a NMOS transistor M8, whose source is connected to ground GND. M8 is part of a current mirror, formed by the NMOS transistors M7 and M8, gate and drain of transistor M7 being interconnected.

The comparator function of FIG. 1 is realized here by voltage-sense PMOS transistor M5, which has its source connected to the gate of transistor M0 and its gate biased by the reference voltage VREF through a diode-connected PMOS transistor M6. The drain of transistor M5 is connected to the drain of M7. The current through transistor M7 is mirrored by transistor M8, the drain of which represents the output of comparator COMP. A capacitor C0 of a few pico farads is connected between the interconnected gates of M5 and M6 and the output of flip-flop FF to provide a positive feedback.

In this specific embodiment, the hold switch (HS in FIG. 1) includes a resistor R0 connected in series with a PMOS transistor M4 between the gate of M0 and the reference voltage source VREF. For driving M4, its gate is connected to the signal input 5.

The signal applied to the gate of "turn-OFF" transistor M2 is of the same polarity as the control input signal at input 5.

In operation, the reference voltage and the gate voltage of transistor M0 are compared by the dynamically biased voltage-sense transistor M5. When the voltage at the source of transistor M5 exceeds the reference voltage VREF minus the voltage drop across transistor M6, M5 gets conducting and forces current into the current mirror formed by the transistors M7 and M8. The drain current of M8 generates a voltage drop across resistor R1, which resets the flip-flop FF. As the output of flip-flop FF is connected to the gate of transistor M1, the reset turns OFF M1 and the gate voltage of power transistor M0 stops to rise. The voltage sensor or comparator COMP formed by the transistors M5/M6 is dynamically biased. This means when M1 is turned ON with a high to low edge on input 1 of FF, the transistor M6 is dynamically biased through capacitor C0. The gate voltage of transistor M5 is then equal to the reference voltage VREF minus the threshold voltage Vt of transistor M6. When M1 is turned OFF, the gates of M5 and M6 are pulled up as well. This turns OFF M5 hard, so transistor M5 cannot have any sub-threshold leakage when M1 is switched OFF and the "hold switch" realized by transistor M4 biases alone through resistor R0 the gate of the power transistor M0. As long as the control input signal remains at low level, M4 is conductive (this corresponds to a closed hold switch) and maintains the gate voltage of M0 on the reference voltage level.

Since the gate charge of power transistor M0 comes directly from VCC during the time when M1 is switched on, M4 does not need to deliver any additional charge to the gate of M0. Therefore the hold switch can have a relatively high impedance and the reference voltage may be used for other purposes as well, as it is not heavily loaded.

The invention has been described for use with a power NMOS transistor. Of course, the inventive power switching circuit also works with a power PMOS transistor. In this case the power PMOS transistor is connected with its source to the supply voltage VCC. The "turn-OFF" switch M2 is then connected with its source to the supply voltage VCC, and the "turn-OFF" switch M2 is a PMOS transistor. Accordingly, the "turn-ON" switch is a NMOS transistor with its source connected to ground. The connection in series of M2 and M1 remains the same. For driving a PMOS power stage the flip-flop may be positive edge triggered, so that the power transistor is turned ON when the control input signal goes from a low level to a high level. Other changes necessary to adapt the circuit of FIG. 2 to the use with a power PMOS transistor, for example, the connection of the comparator circuit to VCC rather than to ground are evident for those skilled in the art.

The invention claimed is:

1. An integrated power switching circuit comprising:
a power MOS transistor that has a maximum source-drain voltage substantially higher than a permissible gate-source voltage, and that has a current path connected in series with a load between first and second supply terminals, further comprising:
a gate driver circuit that has a pair of series-connected switching transistors connected between said first and second supply terminals;
an interconnection node between said switching transistors being connected to the gate of said power MOS transistor;
and the gate driver circuit further comprising:
a reference voltage source and a voltage comparator comparing the gate voltage of the power MOS transistor with the reference voltage and providing a disabling output that disables one of said switching transistors when the gate voltage of the power MOS transistor reaches said reference voltage.

2. The power switching circuit of claim 1, wherein said gate driver circuit comprises a flip-flop with a first input receiving an input signal, an output connected to the gate of one of said switching transistors and a second input connected to an output of the voltage comparator.

3. The power switching circuit of claim 1, wherein said gate driver circuit further comprises a holding switch connected between the gate of the power MOS transistor and the reference voltage source and effective to hold the gate on the reference voltage level when said disabling output of the voltage comparator is provided.

4. The power switching circuit of claim 1, wherein said voltage comparator comprises a voltage-sense MOS transistor that has a source connected to the gate of the power MOS transistor, a gate connected to receive a gate voltage derived from the reference voltage source, and a drain connected to feed current into a current mirror wherein the mirrored current provides said disabling output.

5. The power switching circuit of claim 4, wherein the gate of the voltage-sense MOS transistor is connected to the reference voltage source through a diode-connected MOS transistor.

6. The power switching circuit of claim 2, wherein the gate of the voltage-sense MOS transistor is connected to the output of the flip-flop through a feed-forward capacitor.

* * * * *